(12) United States Patent
Kong et al.

(10) Patent No.: US 9,391,570 B2
(45) Date of Patent: Jul. 12, 2016

(54) ELECTRONIC DEVICE WITH LOW NOISE AMPLIFIER MODULE

(71) Applicant: Apple Inc., Cupertino, CA (US)

(72) Inventors: Daniel C. Kong, Mountain View, CA (US); Bradley D. Scoles, Morgan Hill, CA (US); William J. Noellert, Los Altos, CA (US); Nicholas W. Lum, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 45 days.

(21) Appl. No.: 14/333,912

(22) Filed: Jul. 17, 2014

(65) Prior Publication Data

US 2016/0020737 A1 Jan. 21, 2016

(51) Int. Cl.

| | |
|---|---|
| *H01Q 5/50* | (2015.01) |
| *H03F 3/19* | (2006.01) |
| *H04B 1/40* | (2015.01) |
| *H01Q 21/28* | (2006.01) |
| *H01Q 23/00* | (2006.01) |
| *H04B 1/48* | (2006.01) |

(52) U.S. Cl.
CPC .. *H03F 3/19* (2013.01); *H01Q 5/50* (2015.01); *H01Q 21/28* (2013.01); *H01Q 23/00* (2013.01); *H04B 1/40* (2013.01); *H04B 1/48* (2013.01); *H03F 2200/294* (2013.01); *H03F 2200/451* (2013.01)

(58) Field of Classification Search
CPC ........ H04B 1/44; H04B 7/0404; H04W 88/06
See application file for complete search history.

(56) References Cited

U.S. PATENT DOCUMENTS

| | | |
|---|---|---|
| 7,538,740 B2 | 5/2009 | Korisch et al. |
| 7,937,063 B1 | 5/2011 | Rausch et al. |

(Continued)

FOREIGN PATENT DOCUMENTS

JP  2003347957  12/2003

OTHER PUBLICATIONS

SSB-Electrical GmBH: "Data Sheet DBA-270 Mast Preamplifier", Jan. 26, 2012, XP055219560, Retrieved from the Internet: <URL:http://www.ssb.de/download/EN-1032_DBA280.pdf> [retrieved on Oct. 9 2015].

*Primary Examiner* — David Bilodeau
(74) *Attorney, Agent, or Firm* — Treyz Law Group, P.C.; Michael H. Lyons

(57) ABSTRACT

An electronic device may include an antenna, a transceiver, and a low noise amplifier module that amplifies receive signals from the antenna to the transceiver circuitry in a first configuration and passes transmit signals from the transceiver to the antenna in a second configuration. The low noise amplifier module may include a first switching circuit coupled to the antenna, a second switching circuit coupled to the transceiver, at least one low noise amplifier coupled between the first and second switching circuits, and a transmit bypass path coupled between the first and second switching circuits. The transceiver may be located in a first electronic device region, whereas the low noise amplifier module and the antenna may be located in a second region. The low noise amplifier module may help compensate for signal loss between the first and second regions and allow for transmit signals to pass to the antenna.

16 Claims, 10 Drawing Sheets

(56) References Cited

U.S. PATENT DOCUMENTS

| | | |
|---|---|---|
| 8,374,557 B2 | 2/2013 | Gorbachov |
| 8,400,224 B1 | 3/2013 | Au et al. |
| 2005/0164888 A1 | 7/2005 | Hey-Shipton |
| 2008/0182520 A1 | 7/2008 | Rofougaran |
| 2013/0065541 A1* | 3/2013 | Lum ................. H04W 16/14 455/77 |
| 2013/0148636 A1* | 6/2013 | Lum ................. H04B 1/0064 370/336 |
| 2013/0156080 A1 | 6/2013 | Cheng et al. |
| 2015/0304000 A1* | 10/2015 | Wloczysiak ........ H04B 1/401 455/78 |

* cited by examiner

US 9,391,570 B2

ELECTRONIC DEVICE WITH LOW NOISE AMPLIFIER MODULE

BACKGROUND

This relates generally to electronic devices and, more particularly, to electronic devices with antennas.

Electronic devices often include antennas. For example, cellular telephones, computers, and other devices often contain antennas for supporting wireless communications.

Electronic devices often are required to support wireless communications in multiple frequency bands. With compact electronic devices such as mobile electronic devices, it can be challenging for antenna structures to support the various frequency bands while being limited by device area or volume constraints. One antenna is often required to handle communications in multiple frequency bands.

Front-end circuitry such as filters and switches are used to separate radio-frequency signals of different frequency bands that are received at a particular antenna. The front-end circuitry conveys receive and transmit signals between radio-frequency transceiver circuitry and one or more antennas. However, it can be challenging to ensure adequate wireless performance. For example, antennas may be located at different distances from the transceiver circuitry. An antenna located at a distance away from transceiver circuitry may require connection via a radio-frequency transmission line such as a coaxial cable. Antennas located at different distances may be subject to different amounts of signal loss, which adversely impacts wireless performance. Filters and switches may also impart different amounts of loss when conveying radio-frequency signals of different frequency bands. In addition, signals of different frequency bands can potentially cause interference due to nonlinear circuit operation.

It would therefore be desirable to be able to provide improved radio-frequency front end circuitry for wireless electronic devices.

SUMMARY

An electronic device may include an antenna, transceiver circuitry, and a low noise amplifier module that amplifies receive signals from the antenna to the transceiver circuitry in a first configuration and passes transmit signals from the transceiver circuitry to the antenna in a second configuration. The low noise amplifier module may include a first switching circuit coupled to the antenna, a second switching circuit coupled to the transceiver circuitry, at least one low noise amplifier coupled between the first and second switching circuits, and a transmit bypass path coupled between the first and second switching circuits. Filtering circuitry may be interposed between the first switching circuit and the low noise amplifier to help block transmit signal leakage from reaching the low noise amplifier.

The transceiver circuitry may be located in a first region of the electronic device, whereas the low noise amplifier module and the antenna may be located in a second region of the electronic device. The first and second regions may be located at opposing ends of the electronic device. A transmission line may connect the first and second regions of the electronic device. The transmission line may convey transmit signals from the transceiver circuitry to the low noise amplifier module and may convey the amplified receive signals from the low noise amplifier module to the transceiver circuitry.

The electronic device may include a second antenna in the first region of the electronic device in addition to the first antenna located in the second region of the electronic device. Switching circuitry located in the first region of the electronic device may selectively couple transmitter circuitry in the transceiver circuitry to the first and second antennas to provide antenna transmit diversity. The low noise amplifier module may help compensate for signal loss over the transmission line while accommodating antenna transmit diversity operations by passing transmit signals to the first antenna.

The low noise amplifier module may include multiple low noise amplifiers each handling amplification of receive signals in different frequency bands. Filtering circuitry may be provided to filter the receive signals into the frequency bands for amplification by the low noise amplifiers.

DETAILED DESCRIPTION

Figure 1:
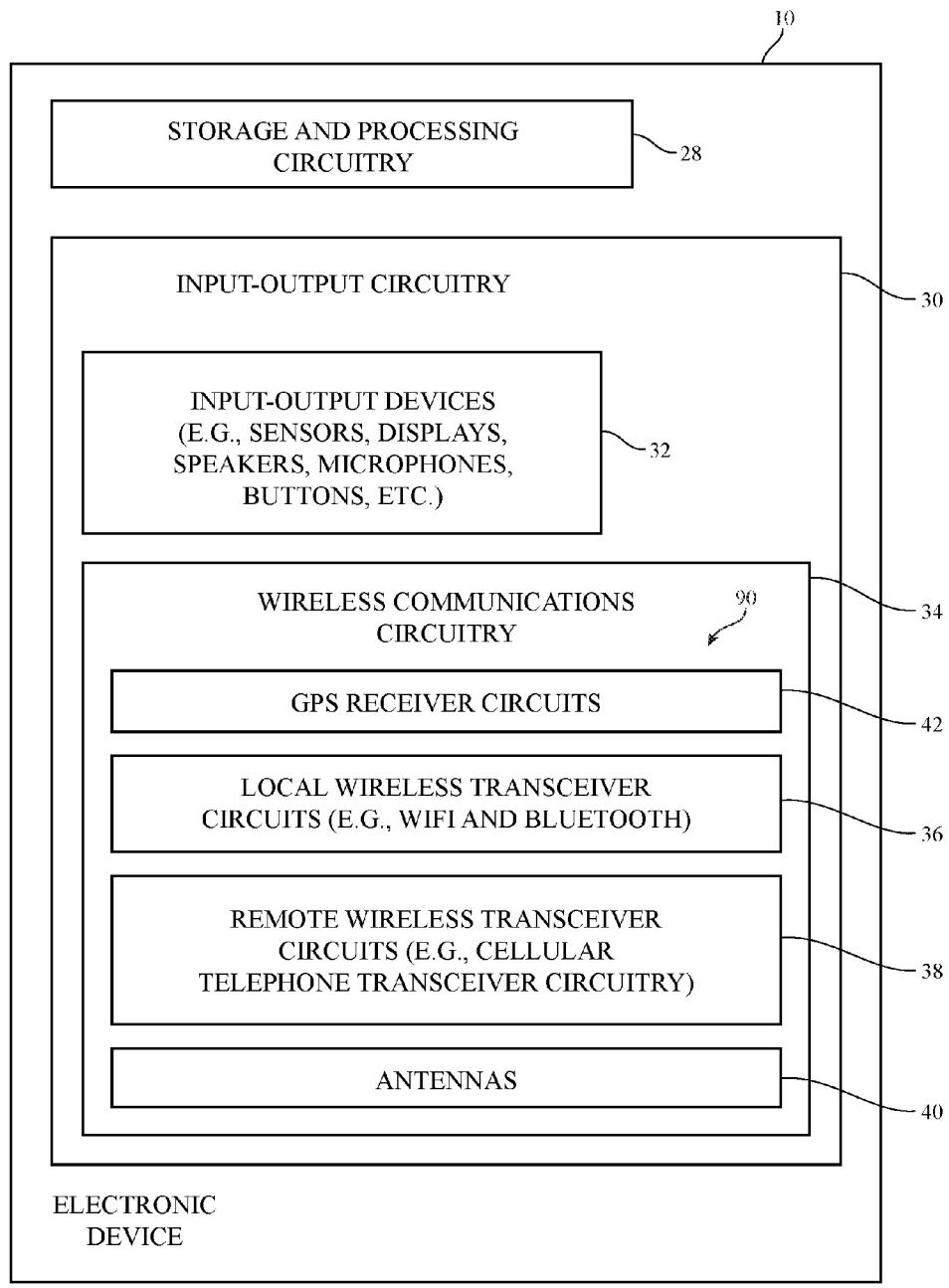
FIG. 1 is a block diagram of an illustrative electronic device with wireless circuitry in accordance with an embodiment.

Electronic devices such as device 10 of FIG. 1 may be provided with wireless communications circuitry. The wireless communications circuitry may be used to support long-range wireless communications such as communications in cellular telephone bands. Examples of long-range (cellular telephone) bands that may be handled by device 10 include the 800 MHz band, the 850 MHz band, the 900 MHz band, the 1800 MHz band, the 1900 MHz band, the 2100 MHz band, the 700 MHz band, and other bands. The long-range bands used by device 10 may include the so-called LTE (Long Term Evolution) bands. The LTE bands are numbered (e.g., 1, 2, 3, etc.) and are sometimes referred to as E-UTRA operating bands. Long-range signals such as signals associated with satellite navigation bands may be received by the wireless communications circuitry of device 10. For example, device 10 may use wireless circuitry to receive signals in the 1575 MHz band associated with Global Positioning System (GPS) communications. Short-range wireless communications may also be supported by the wireless circuitry of device 10. For example, device 10 may include wireless circuitry for handling local area network links such as WiFi® links at 2.4 GHz and 5 GHz, Bluetooth® links at 2.4 GHz, etc.

As shown in FIG. 1, device 10 may include storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Storage and processing circuitry 28 may be used to run software on device 10, such as internet browsing applications, voice-over-internet-protocol (VOIP) telephone call applications, email applications, media playback applications, operating system functions, functions related to communications band selection during radio-frequency transmission and reception operations, etc. To support interactions with external equipment, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, cellular telephone protocols, MIMO (multiple input multiple output) protocols, antenna diversity protocols, etc. Wireless communications operations such as communications band selection operations may be controlled using software stored and running on device 10 (i.e., stored and running on storage and processing circuitry 28 and/or input-output circuitry 30).

Input-output circuitry 30 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens, displays without touch sensor capabilities, buttons, joysticks, click wheels, scrolling wheels, touch pads, key pads, keyboards, microphones, cameras, buttons, speakers, status indicators, light sources, audio jacks and other audio port components, digital data port devices, light sensors, motion sensors (accelerometers), capacitance sensors, proximity sensors, etc.

Input-output circuitry 30 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 34 may include transceiver circuitry 36, 38, and 42. Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as at 850 MHz, 900 MHz, 1800 MHz, 1900 MHz, and 2100 MHz and/or the LTE bands and other bands (as examples). Circuitry 38 may handle voice data and non-voice data. Wireless communications circuitry 34 may include baseband circuitry that handles baseband signals that are up-converted to radio-frequency (e.g., during signal transmission) or down-converted (e.g., during signal reception).

Wireless communications circuitry 34 may include global positioning system (GPS) receiver equipment such as GPS receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include one or more antennas 40. Antennas 40 may be formed using any suitable antenna types. For example, antennas 40 may include antennas with resonating elements that are formed from loop antenna structure, patch antenna structures, inverted-F antenna structures, slot antenna structures, planar inverted-F antenna structures, helical antenna structures, hybrids of these designs, etc. Different types of antennas may be used for different bands and combinations of bands. For example, one type of antenna may be used in forming a local wireless link antenna and another type of antenna may be used in forming a remote wireless link antenna.

Antenna diversity schemes may be implemented in which multiple redundant antennas are used in handling communications for a particular band or bands. In an antenna diversity scheme, storage and processing circuitry 28 may select which antenna to use in real time based on signal strength measurements or other data. In multiple-input-multiple-output (MIMO) schemes, multiple antennas may be used to transmit and receive multiple data streams, thereby enhancing data throughput.

Figure 2:
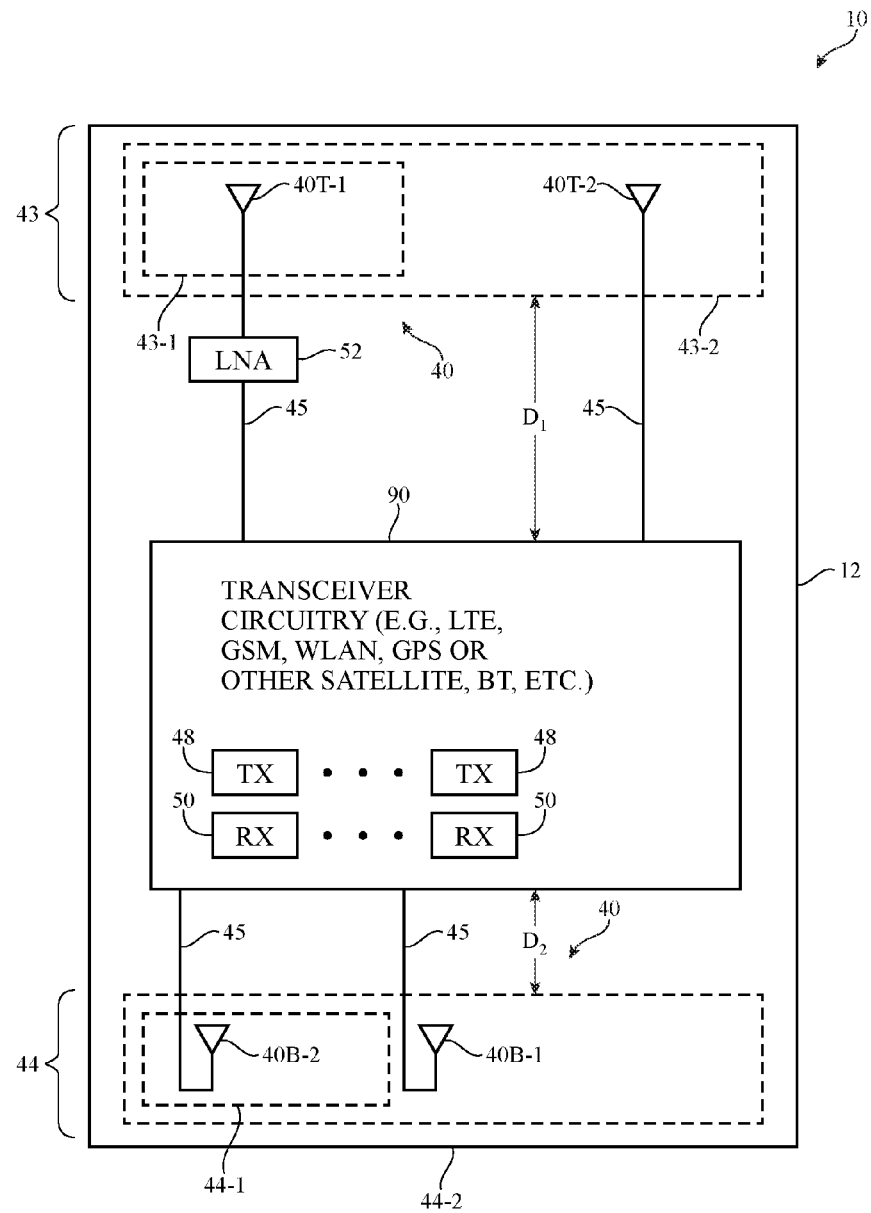
FIG. 2 is a schematic view of an illustrative electronic device with low noise amplifier circuitry that passes transmit signals in accordance with an embodiment.

Illustrative locations in which antennas 40 may be formed in device 10 are shown in FIG. 2. As shown in FIG. 2, electronic device 10 may have a housing such as housing 12. Housing 12 may include plastic walls, metal housing structures, structures formed from carbon-fiber materials or other composites, glass, ceramics, or other suitable materials. Housing 12 may be formed using a single piece of material (e.g., using a unibody configuration) or may be formed from a frame, housing walls, and other individual parts that are assembled to form a completed housing structure. The components of device 10 that are shown in FIG. 1 may be mounted within housing 12. Antenna structures 40 may be mounted within housing 12 and may, if desired, be formed using parts of housing 12. For example, housing 12 may include metal housing sidewalls, peripheral conductive members such as band-shaped members (with or without dielectric gaps), conductive bezels, and other conductive structures that may be used in forming antenna structures 40.

As shown in FIG. 2, antenna structures 40 may be coupled to transceiver circuitry 90 by paths such as paths 45. Paths 45 may include transmission line structures such as coaxial cables, microstrip transmission lines, stripline transmission lines, etc. Paths 45 may also include impedance matching circuitry, filter circuitry, and switching circuitry. Impedance matching circuitry may be used to ensure that antennas 40 are efficiently coupled to transceiver circuitry 90 in communications bands of interest. Filter circuitry may be used to implement frequency-based multiplexing circuits such as diplexers, duplexers, or other multiplexing circuits. Switching circuitry may be used to selectively couple antennas 40 to desired ports of transceiver circuitry 90. For example, in one operating mode a switch may be configured to route one of paths 45 to a given antenna and in another operating mode the switch may be configured to route a different one of paths 45 to the given antenna. The use of switching and filtering circuitry between transceiver circuitry 90 and antennas 40 allows device 10 to support multiple communications bands of interest with a limited number of antennas.

In a device such as a cellular telephone that has an elongated rectangular outline, it may be desirable to place antennas 40 at one or both ends of the device. As shown in FIG. 2, for example, some of antennas 40 may be placed in upper end region 43 of housing 12 and some of antennas 40 may be placed in lower end region 44 of housing 12. The antenna structures in device 10 may include a single antenna in region 43, a single antenna in region 44, multiple antennas in region 43, multiple antennas in region 44, or may include one or more antennas located elsewhere in housing 12.

Antenna structures 40 may be formed within some or all of regions such as regions 43 and 44. For example, an antenna such as antenna 40T-1 may be located within region 43-1 or an antenna such as antenna 40T-2 may be formed that fills some or all of region 43-1. An antenna such as antenna 40B-1 may fill some or all of region 44-2 or an antenna such as antenna 40B-2 may be formed in region 44-1. These types of arrangements need not be mutually exclusive. For example, region 44 may contain a first antenna such as antenna 40B-1 and a second antenna such as antenna 40B-2.

Transceiver circuitry 90 may contain transmitters such as transmitters 48 and receivers such as receivers 50. Transmitters 48 and receivers 50 may be implemented using one or more integrated circuits (e.g., cellular telephone communications circuits, wireless local area network communications circuits, circuits for Bluetooth® communications, circuits for receiving satellite navigation system signals, power amplifier circuits for increasing transmitted signal power, low noise amplifier circuits for increasing signal power in received signals, other suitable wireless communications circuits, and combinations of these circuits).

Device 10 may be a relatively large device (e.g. the lateral dimensions of housing 12 may be tens of centimeters or larger) or may be a relatively compact device such as a handheld device that has a longitudinal dimension along the main axis of housing 12 that is 15 cm or less, 10 cm or less, or 5 cm or less, and that has smaller transverse dimensions.

In some scenarios, antennas 40 may be located at different distances from transceiver circuitry 90. In the example of FIG. 2, upper device region 43 may be separated from transmitters 48 and receivers 50 of transceiver 90 by distance D1, whereas lower device region 44 may be separated from transceiver 90 by distance D2. Distance D1 may be greater than distance D2. For example, transceiver circuitry 90 may be mounted on a printed circuit board nearby or adjacent to lower region 44. Transmit and receive signals passed between transceiver circuitry 90 and upper region 43 may therefore traverse longer paths 45 than signals between transceiver circuitry 90 and lower region 44.

Paths 45 may cause loss in signals that are conveyed across the paths. The amount of loss is dependent on the length of the paths such that longer paths exhibit greater amounts of signal loss, whereas shorter paths have less signal loss. Paths 45 between upper device region 43 and transceiver circuitry 90 are longer than paths 45 between lower device region 44 and transceiver circuitry 90, and therefore signals for antennas in upper device region 43 may experience a greater amount of signal loss.

Low noise amplifier module 52 may be interposed in path 45 between an antenna of region 43 (e.g., antenna 40T-1) and transmitters and receivers of transceiver circuitry 90. Low noise amplifier module 52 may help to compensate for signal loss between antenna 40T-1 and receivers 50 (e.g., signal loss due to the increased length of transmission path 45) by amplifying received antenna signals. For example, low noise amplifier module 52 may provide about 3 dB of amplification for signals received by antenna 40T-1.

Low noise amplifier module 52 may be connected to one or more antennas 40 in upper region 43. In some scenarios, amplification may be omitted. For example, paths 45 may provide sufficient wireless performance for the wireless communications at antenna 40T-2 without amplification by low noise amplifier module 52.

During normal operation, one or more antennas 40 may experience degraded performance. For example, a user may inadvertently block antennas in lower region 44 or antennas in upper region 43. To help ensure adequate wireless performance, antennas 40 of device 10 may be configured to implement antenna transmit diversity. In particular, switching circuitry in paths 45 may be configured to swap which antennas are used for transmitting radio-frequency signals. In response to detecting reduced performance at a first antenna in a first region of device 10 (e.g., lower region 44), device 10 may configure the switching circuitry to route transmit signals to a second, opposing antenna in a second region of device 10 (e.g., upper region 44 that is located at an opposite end of device 10).

Low noise amplifier module 52 may be provided with the capability of passing transmit signals from transmitters 48 to antennas in addition to amplifying receive signals from the antennas. Module 52 may therefore be sometimes referred to herein as a bi-directional module, because module 52 passes signals in both directions between antennas and transceiver circuitry. The bi-directional capabilities of module 52 may help to accommodate transmit diversity (e.g., when transmit signals are routed to antenna 40T-1) in addition to compensating for receive signal loss due to longer signal path lengths.

Figure 3:
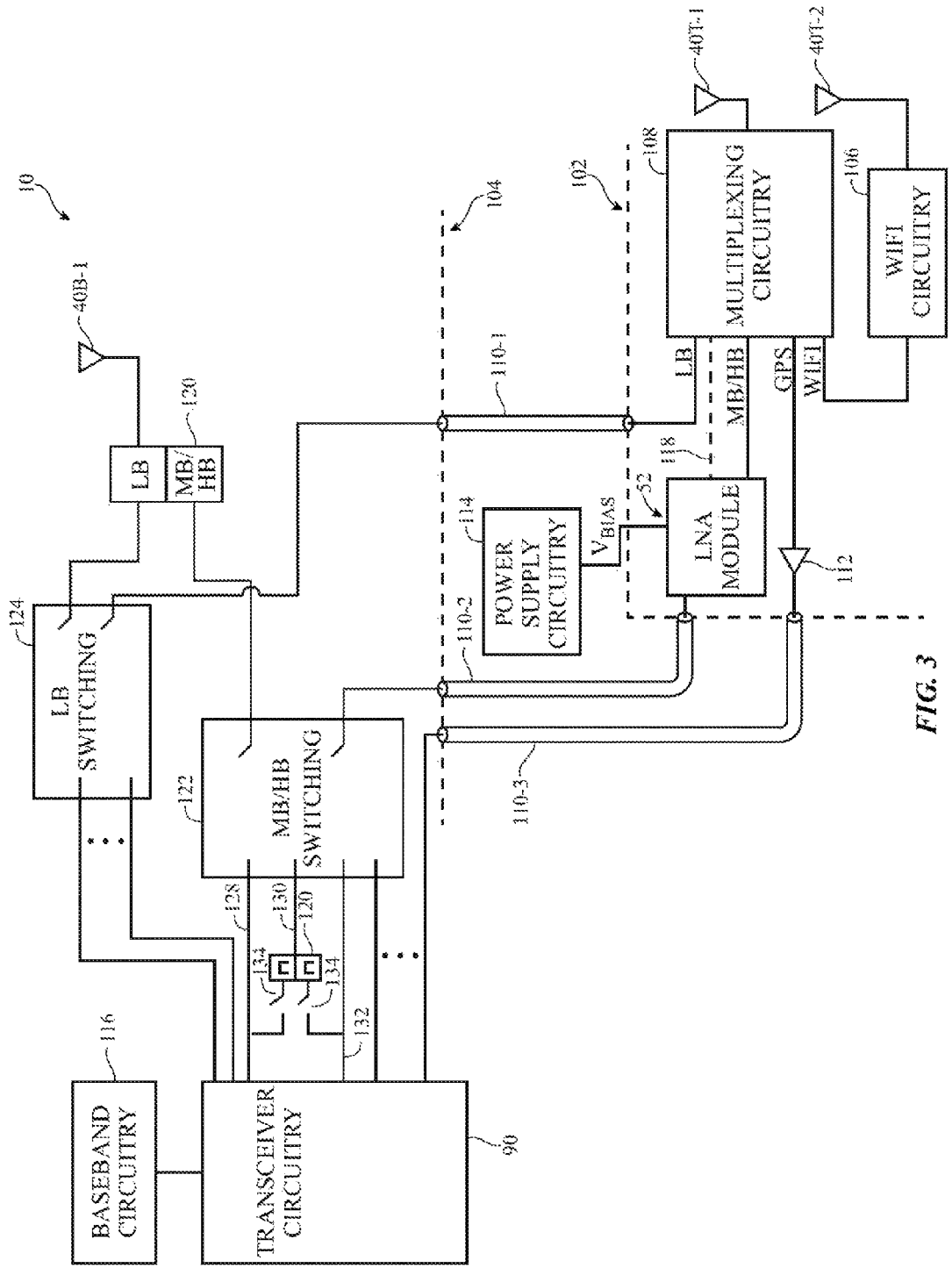
FIG. 3 is a diagram of an illustrative electronic device including low noise amplifier circuitry that may compensate for signal loss in a transmission line that connects first and second regions of the electronic device in accordance with an embodiment.

Each antenna may be configured to handle wireless communications in multiple radio-frequency bands. FIG. 3 is a diagram of an illustrative electronic device 10 in which antennas handle multiple radio-frequency bands.

As shown in FIG. 3, device 10 may include wireless circuitry in regions 102 and 104 of the electronic device. For example, region 102 may include upper device region 43 of FIG. 2, whereas region 104 may include lower device region 44.

Region 102 of device 10 may include antennas 40T-1 and 40T-2. Antennas 40T-1 and 40T-2 may handle wireless communications in different communications bands. In the example of FIG. 3, antenna 40T-1 may handle cellular, GPS, and WiFi signals in frequency bands within the 699-2690 MHz frequency range, whereas antenna 40T-2 may handle WiFi signals in the 5 GHz WiFi frequency band.

WiFi transmit and receive signals associated with antennas 40T-1 and 40T-2 may be handled by WiFi communications circuitry 106. WiFi communications circuitry 106 may include transceiver circuitry such as WiFi transceiver circuitry 36 of FIG. 1. In the example of FIG. 3, WiFi communications circuitry is located in region 102. If desired, WiFi communications circuitry (e.g., including transceiver and/or baseband circuitry) may be located at any desired location within device 10.

Region 102 may include frequency-based multiplexing circuitry 108 that helps to separate wireless signals in different frequency bands. Multiplexing circuitry 108 may include filters that isolate wireless signals in different ranges of frequencies. In the example of FIG. 3, multiplexing circuitry 108 may isolate low band (LB) signals, combined mid-band (MB) and high-band (HB) signals, GPS signals, and WiFi signals (e.g., for 2.4 GHz WiFi). For example, multiplexing circuitry 108 may include a filter that covers multiple low bands such as cellular LTE bands 12, 13, 17, 28, 29, 20, 27, 26, 8 etc. As another example, multiplexing circuitry 108 may include a filter that covers multiple mid-bands and high-bands such as cellular LTE bands 25, 1, 3, 4, 7, 30, etc.

Region 102 may be relatively remote to region 104 that includes transceiver circuitry 90. For example, region 102 may be an upper device region located at first end of device 10, whereas region 104 may be a lower device region located at a second, opposing end of device 10. Region 102 may be connected to region 104 via transmission lines 110 such as coaxial transmission lines (e.g., 110-1, 110-2, and 110-3). Due to the length of transmission lines 110, signals for antenna 40T-1 in region 102 may experience greater signal loss than signals for antenna 40B-1 in region 104 (e.g., because antenna 40T-1 is located farther from transceiver 90 than antenna 40B-1).

Amplifier circuitry may be provided in region 102 to help compensate for increased signal loss associated with antenna 40T-1. Wireless communications such as GPS that are receive-only may be provided with a low noise amplifier (LNA) such as LNA 112. Wireless communications such as cellular communications that potentially require bi-directional communications may be provided with a bi-directional amplifier module 52 that provides low noise amplification for receive signals in addition to passing transmit signals. As shown in FIG. 3, amplifier module 52 may be connected to and handle radio-frequency signals in mid-band and high-band frequencies. If desired, amplifier module 52 may be connected to the low band filter via optional path 118 and handle radio-frequency signals in the low frequency band.

Low noise amplifier module 52 may receive a bias voltage VBIAS from power supply circuitry 114. Bias voltage VBIAS may bias transistors in module 52 to provide a desired amount of linearity while conserving power. For example, bias voltage VBIAS may be a bias voltage provided to the gates of transistors or may be a power supply voltage (e.g., VDD) that supplies power to the transistors. If desired, power supply circuitry 114 may adjustable and provide an adjustable bias voltage that is adjusted in real time based on desired amplifier performance.

Region 104 of device 10 may include transceiver circuitry 90, baseband circuitry 116, and front-end circuitry such as switches and filters. Transceiver circuitry 90 handles transmitting and receiving radio-frequency signals. Transceiver circuitry 90 may receive baseband transmit signals from baseband circuitry 10 and up-convert the baseband transmit signals into radio-frequency signals in appropriate frequency bands. Transceiver circuitry 90 may receive radio-frequency signals from antennas 40 and down-convert the radio-frequency receive signals to baseband receive signals for processing by baseband circuitry 116.

Front-end circuitry in region 104 of device 10 may include switching circuitry 122 and 124 and diplexer 120. Diplexer 120 may serve to isolate and separate signals of different frequency ranges for antenna 40B-1. Low band signals may be isolated from mid-band and high-band signals. Low band signals associated with antennas 40B-1 and 40T-1 may be routed to respective ports of low band switching circuitry 124. Low band switching circuitry may be coupled to transceiver circuitry 90 via multiple paths that each handles wireless communications in a respective portion of the low band. For example, the low band may include multiple cellular bands each associated with a respective path between transceiver circuitry 90 and low band switching circuitry 124. Low band switching circuitry 124 may be configured to select which antenna is used for transmitting and/or receiving signals. For example, low band switching circuitry 124 may be configured for antenna transmit diversity by selecting which antenna is connected to transceiver circuitry 90 during transmit operations in the low band frequency range.

Mid-band and high-band (MB/HB) switching circuitry 122 may be similarly connected to antennas 40B-1 and 40T-1 to provide transmit diversity capabilities. Duplexers such as duplexer 126 may be used to provide carrier aggregation capabilities. Duplexer 126 includes two filters that isolate radio-frequency signals in different frequency bands. Duplexer 126 includes a first port that is coupled to MB/HB switching circuitry 122 via path 130. Duplexer 126 includes second and third ports that are coupled via switches 134 to paths 128 and 130, respectively. Duplexer 126 allows for combining transmit signals in different frequency bands and separating receive signals for processing.

As an example, path 128 may convey LTE band 1 to and from transceiver circuitry 90, whereas path 132 handles LTE band 7 signals. During carrier aggregation operations, switches 134 may be closed (enabled) to pass the LTE band 1 and band 7 signals to duplexer 126. Duplexer 126 provides combined LTE band 1 and band 7 signals to switching circuitry 122 via path 130. Similarly, receive signals from the antennas may be separated in frequency bands by duplexer 126 and conveyed to transceiver circuitry 90 over appropriate paths 128 and 132.

Switches 134 and paths 128 and 132 may provide improved performance in scenarios such as when device 10 can operate in carrier aggregation and non-carrier aggregation modes. Consider the scenario in which LTE communications sometimes requires carrier aggregation between first and second LTE frequency bands and requires independent communications in the first and second LTE bands at other times. In this scenario, switches 134 may be closed to enable carrier aggregation and opened to disable carrier aggregation between the frequency bands of paths 128 and 132. When switches 134 are opened, communications on paths 128 and 132 may be performed independently without any losses from duplexer 126 (e.g., because duplexer 126 is disconnected from paths 128 and 132).

Front-end circuitry such as switching circuitry 122, 124, and 134 may be controlled by baseband circuitry 116 via respective control signal paths (not shown) that couple baseband circuitry 116 to each circuit. Similarly, baseband circuitry 116 may provide control signals that control power supply circuitry 114 to provide a desired VBIAS to amplifier module 52.

Figure 4:
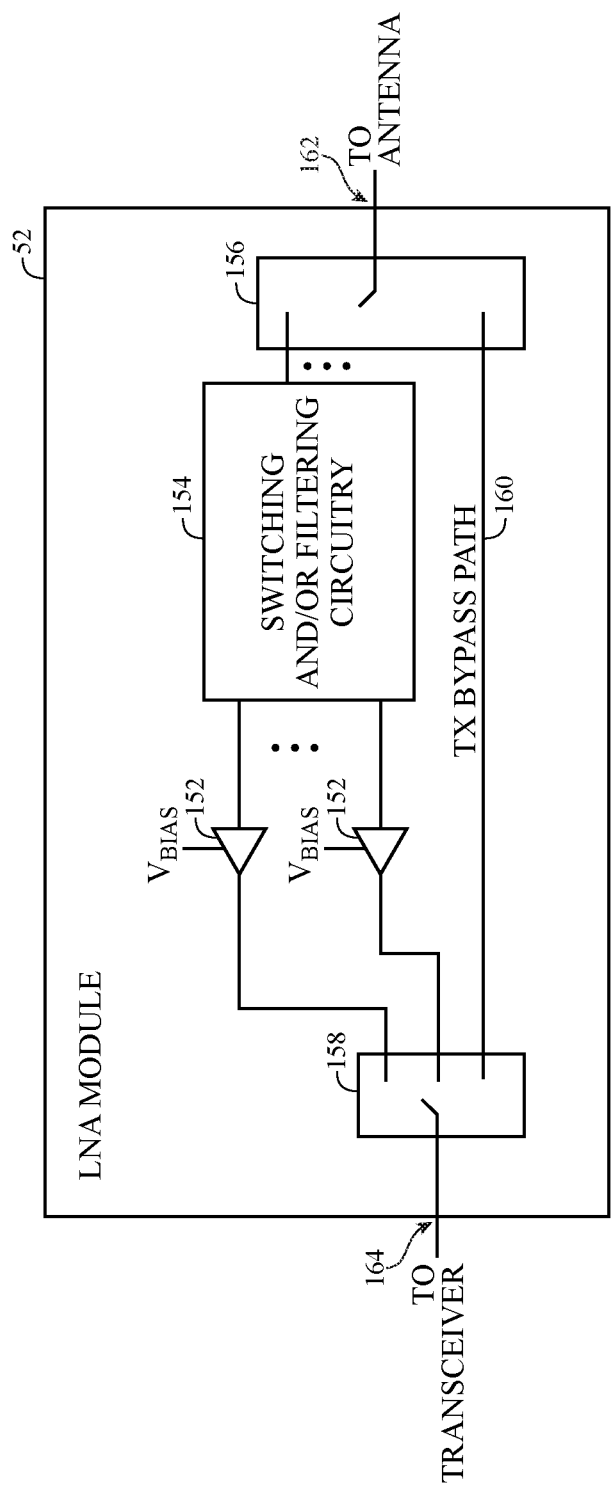
FIG. 4 is a diagram of illustrative low noise amplifier circuitry that passes transmit signals via a transmit bypass path in accordance with an embodiment.

FIG. 4 is an illustrative diagram of a low noise amplifier module 52 that passes transmit signals in addition to providing low noise amplification of receive signals. As shown in FIG. 4, amplifier module 52 may include low noise amplifiers 152 and transmit (TX) bypass path 160 coupled in parallel between switching circuitry 156 and 158. Each low noise amplifier 152 may amplify signals in a respective set of one or more frequency bands (e.g., LTE frequency bands). Switching circuitry 156 and 158 may be configured (e.g., by baseband circuitry) to selectively couple one of the low noise amplifiers 152 (e.g., in a first switch configuration) or transmit bypass path 160 (e.g., in a second switch configuration) to the antenna via port 162. Similarly, switching circuitry 156 and 158 may be configured to selectively couple one of the low noise amplifiers 152 or transmit bypass path 160 to transceiver circuitry via port 164. If desired, switching circuitry 156 and 158 may be configured to simultaneously connect transmit bypass path 160 and a low noise amplifier 152 between ports 162 and 164.

Switching and/or filter circuitry 154 may be used to separate and isolate signals for low noise amplifiers 152 (e.g., signals in different LTE frequency bands for each respective low noise amplifier).

Transmit bypass path 160 provides amplifier module 52 with the capability of passing transmit signals from port 164 to port 162 in addition to low noise amplification capabilities provided by low noise amplifiers 152. Switching circuitry 156 and 158 may electrically disconnect LNA amplifiers 152 during an antenna diversity mode in which transmit bypass path 160 is electrically connected between ports 164 and 162. If desired, switching circuitry 156 and 158 may toggle between connecting LNA amplifiers 152 and TX bypass path (e.g., in a time sharing arrangement), may simultaneously connect transmit bypass path 160 and a low noise amplifier 152.

Figure 5:
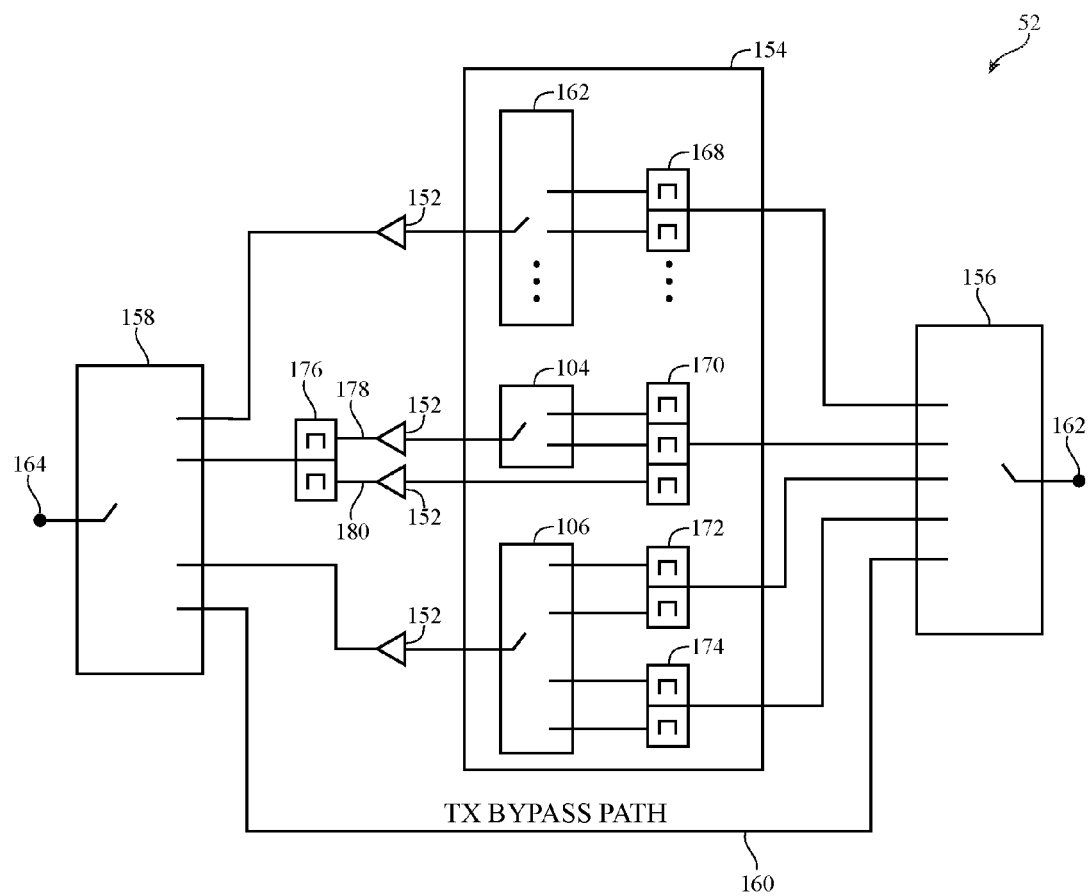
FIG. 5 is a diagram of illustrative low noise amplifier circuitry that passes transmit signals via a transmit bypass path and includes filtering and switching circuitry that separates radio-frequency bands for low noise amplifiers in accordance with an embodiment.

Switching and filter circuitry 154 may include any desired combination of switching and filtering circuitry for separating and isolating signals for amplification by low noise amplifiers 152. FIG. 5 is a diagram of amplifier module 52 with illustrative switching and filter circuitry 154. As shown in FIG. 5, circuitry 154 may include switching circuitry 162, 164, and 166 and filtering circuitry such as duplexers 168, 172, and 174, and triplexer 170. Duplexers 168, 172, and 174, and triplexer 170 separate signals in different frequency bands (e.g., LTE bands) while helping to reduce the number of required switch ports on switching circuitry 156 (e.g., by combining signals of multiple frequency bands).

Switches 162, 164, and 166 may select between paths associated with different frequency bands and also help to ensure isolation between the frequency bands. As shown in FIG. 5, each switch of circuitry 154 may have any desired number of switch ports (e.g., two, three, four, or more) that are selectively coupled to a low noise amplifier 152 for amplification.

If desired, multiple LNA paths (i.e., paths between switches 156 and 158 that include LNAs 152) may be combined when coupling to switch 158 by filters such as duplexer 176. Duplexer 176 may help to ensure that signals associated with LNA paths 178 and 180 are isolated. In other words, duplexer 176 may help to prevent interference between paths 178 and 180.

In some scenarios, communications at two different frequencies can cause interference at a third frequency. Consider the scenario in which path 180 handles LTE band 7 receive signals between 2620 to 2690 MHz, whereas transceiver circuitry simultaneously transmits radio-frequency signals in LTE band 7 from antenna 40B-1 of FIG. 3 and handles WiFi communications with antenna 40T-1. WiFi signals at 2.4 GHz may leak to the inputs of LNA amplifiers 152 (e.g., due to imperfect filtering at multiplexing circuitry 108 of FIG. 3), whereas the LTE band 7 transmit signals may leak to the outputs of LNA amplifiers 152 (e.g., due to imperfect isolation at MB/HB switching circuitry 122. In this scenario, intermodulation at the output of LNAs 152 (sometimes referred to as reverse intermodulation) may produce third order nonlinearities at frequencies within the LTE band 7 receive range (i.e., 2620 to 2690). Duplexer 176 may help to prevent such reverse modulation scenarios, because duplexer 176 helps prevent mixing of the WiFi and LTE band 7 transmit signals at the output of LNA amplifiers 152 on paths 178 and 180. If desired, the linearity of amplifiers 152 on paths 178 and 180 may be adjusted in response to scenarios in which reverse intermodulation may occur (e.g., when antenna 40T-1 is handling 2.4 GHz WiFi and LTE band 7 receive and antenna 40B-1 is handling LTE band 7 transmit). The linearity of amplifiers 152 may be adjusted by baseband circuitry via control signals that direct adjustable power supply circuitry to adjust the bias voltages provided to the amplifiers.

The example of FIG. 5 in which switching and filter circuitry 154 is used to partition communications in frequency for LNA paths is merely illustrative. If desired, switching circuitry in some or all of the LNA paths may be omitted such that each LNA 152 handles radio-frequency signals in only one communications frequency band. For example, switching circuitry 162 may be omitted and a low noise amplifier 152 may be connected to each filter of duplexer 168 (i.e., the ratio of low noise amplifiers to receive bands may be 1:1). Omission of switching circuitry may help to improve performance, whereas use of switching circuitry may help to minimize the number of low noise amplifiers and therefore potentially reduce cost.

Figure 6:
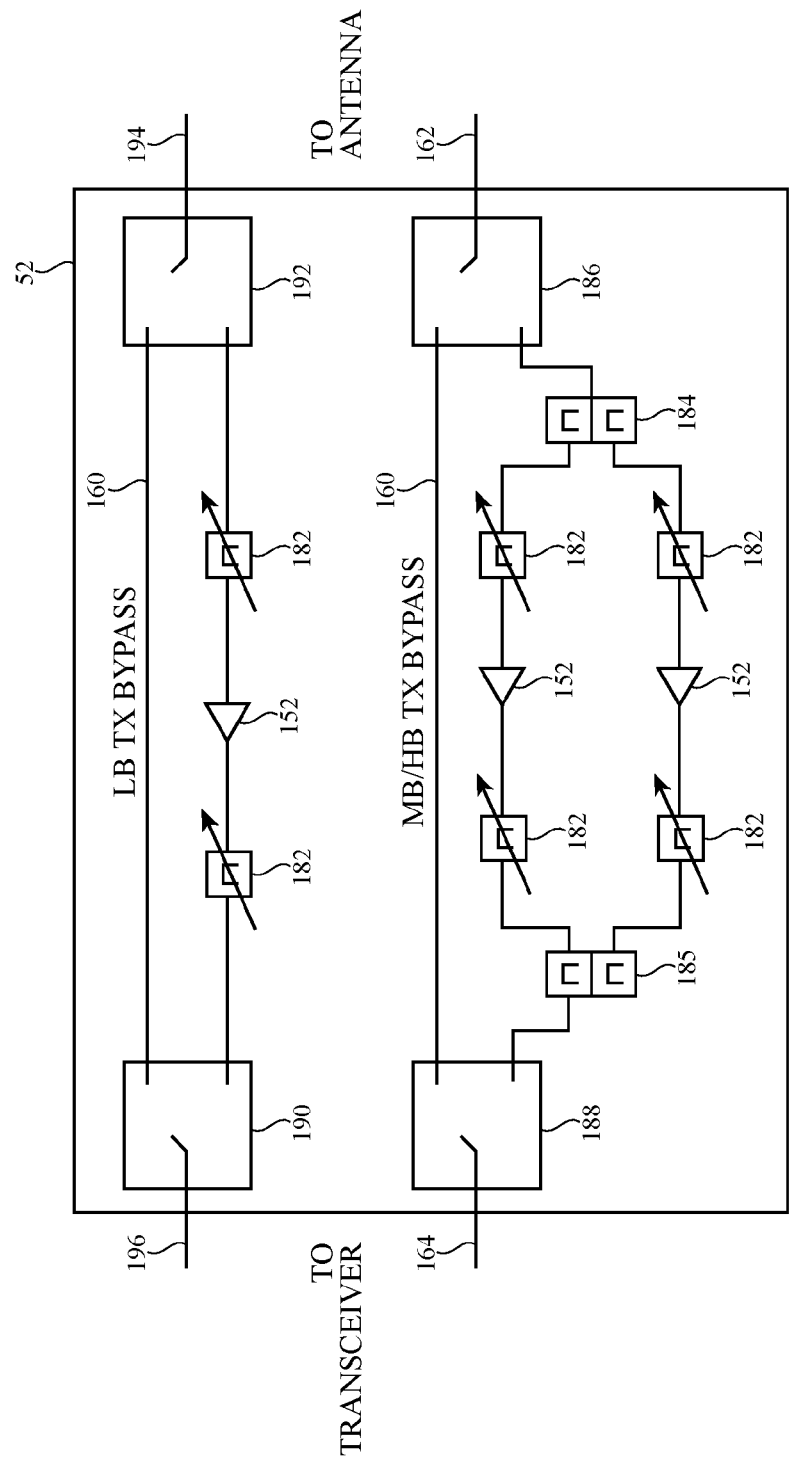
FIG. 6 is a diagram of illustrative low noise amplifier circuitry that passes transmit signals via a transmit bypass path and includes tunable filters for handling multiple frequency bands in accordance with an embodiment.

The example of FIG. 5 in which multiple frequency filters for low noise amplifiers 152 are used is merely illustrative. As shown in FIG. 6, tunable filter circuitry may be used in separately amplifying receive signals. Tunable filters 182 may be adjusted independently or in groups by control signals provided by baseband circuitry over control paths. For example, tunable filters 182 may be adjusted to pass only radio-frequency signals within a desired frequency band while rejecting signals outside of the desired frequency band. If desired, duplexers 184 and 185 may be coupled to LNAs 152 to provide carrier aggregation. Duplexer 184 may separate receive signals for separate amplification by LNAs 152, whereas duplexer 185 may combine the amplified signals for conveying to transceiver circuitry.

Switches 186 and 188 may be configured to selectively connect TX and RX paths between transceiver circuitry and antennas, which provides amplifier module 52 with the capability of low noise amplification via amplifiers 152 in addition to passing transmit signals via bypass path 160.

In the example of FIG. 6, amplifier module 52 may include ports 194 and 196 that handle low band signals (e.g., port 194 may be connected to a port of multiplexing circuitry 108 for low band signals via path 118 of FIG. 3). Amplifier module 52 may include low noise amplifier circuitry with a low band transmit bypass path 160 similarly to MB/HB amplifier circuitry connected between ports 162 and 164. The low band circuitry may include only one LNA path (LNA 152 and tunable filters 182) as shown in FIG. 6 or may include additional LNA paths and, if desired, may include filters such as duplexer 185 for carrier aggregation of LTE bands within the low band frequency range.

Figure 7:
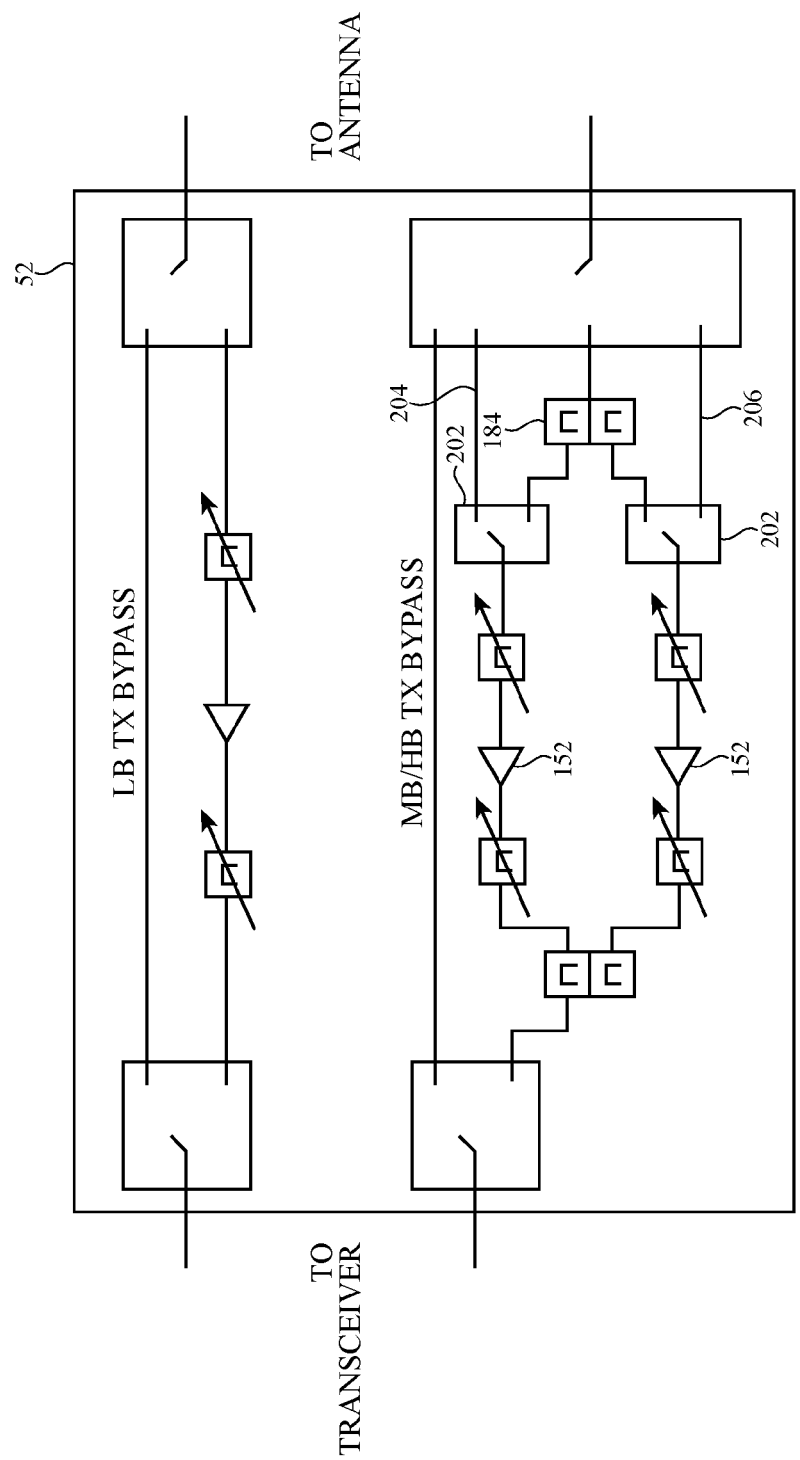
FIG. 7 is a diagram of illustrative low noise amplifier circuitry that passes transmit signals via a transmit bypass path and includes carrier aggregation bypassing switches in accordance with an embodiment.

As shown in FIG. 7, additional switching circuits may be added to module 52 of FIG. 6 to provide dedicated paths when carrier aggregation is disabled or otherwise used. Additional switches 202 may be interposed between LNAs 152 and duplexer 184. Switches 202 may be configured to switch between a first configuration in which carrier aggregation is performed using duplexer 184 and a second configuration in which switches 202 connect LNAs 152 to paths 204 and 206 (e.g., bypassing duplexer 184, which prevents signal loss associated with duplexer 184). In the second configuration, paths 204 and 206 may independently handle radio-frequency signals on different frequency bands.

Figure 8:
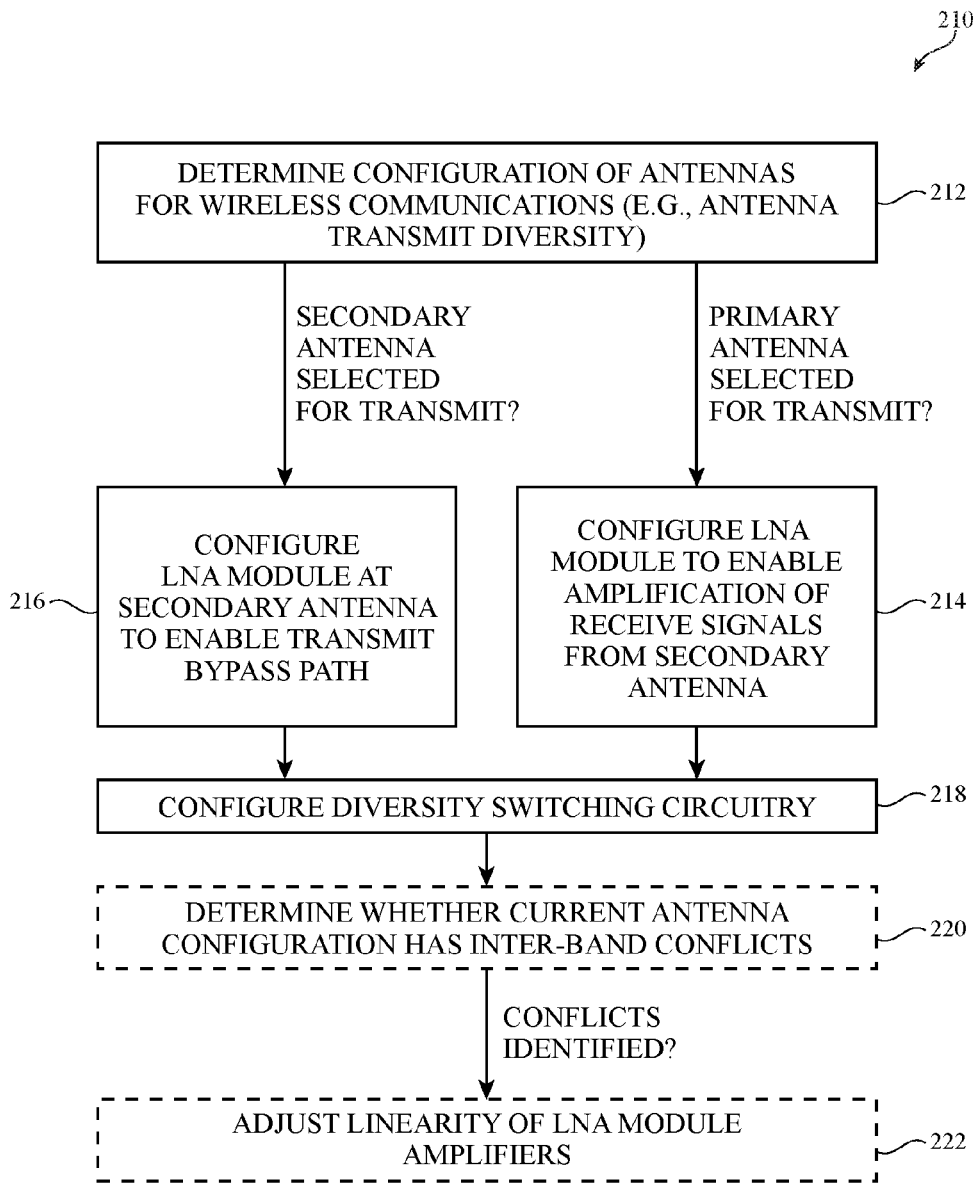
FIG. 8 is a flow chart of illustrative steps that may be performed in configuring and using a low noise amplifier module having transmit bypass capabilities in accordance with an embodiment.

FIG. 8 is a flow chart 210 of illustrative steps that may be used in configuring a low noise amplifier module having transmit bypass and using the low noise amplifier module to amplify receive signals while accommodating transmit diversity. The operations of flow chart 210 may, for example, be performed by generating and providing control signals using baseband circuitry or other control circuitry in an electronic device. The electronic device may implement antenna transmit diversity using a primary antenna that is normally used for signal transmission and a secondary antenna (diversity antenna) that may be used for signal transmission when the primary antenna has poor performance. The low noise amplifier module may be connected to the secondary antenna (e.g., because the secondary antenna is typically located farther from the transceiver circuitry than the primary antenna).

During step 212, the control circuitry may determine a desired configuration of antennas for wireless communications. The desired configuration may be determined based on information received from a base station (e.g., instructions for carrier aggregation), based on detected antenna performance (e.g., whether an antenna is blocked or otherwise performing poorly), etc. In response to selecting the secondary antenna for transmitting, the operations of step 216 may be performed. In response to selecting the primary antenna for transmitting, the operations of step 214 may be performed.

During step 214, the control circuitry may configure the low noise amplifier module at the secondary antenna in a first configuration that electrically couples the secondary antenna to a transceiver through a low noise amplifier. For example, switches 158, 156, and 154 of FIG. 4 may be configured to connect port 164 to port 162 via one of low noise amplifiers 152.

During step 216, the control circuitry may configure the low noise amplifier module at the secondary antenna in a second configuration that enables a transmit bypass path. For example, switches 156 and 158 of FIG. 4 may be configured to connect port 164 to port 162 via transmit bypass path 160.

During step 218, the control circuitry may configure diversity switching circuitry (e.g., switches 122 and/or 124) to implement the desired antenna configuration (e.g., connecting the antennas to desired ports on transceiver circuitry 90).

During optional step 220, the control circuitry may determine whether the current antenna configuration has potential inter-band conflicts. For example, the control circuitry may determine whether nonlinearities such as reverse intermodulation at the low noise amplifier module can cause interference between communications in different frequency bands. In response to identifying conflicts, the control circuitry may adjust the linearity of the amplifier(s) in the low noise amplifier module that are affected. For example, the control circuitry may provide a control signal to adjustable power supply voltage circuitry to provide an adjusted power supply voltage to the affected amplifiers.

Figure 9:
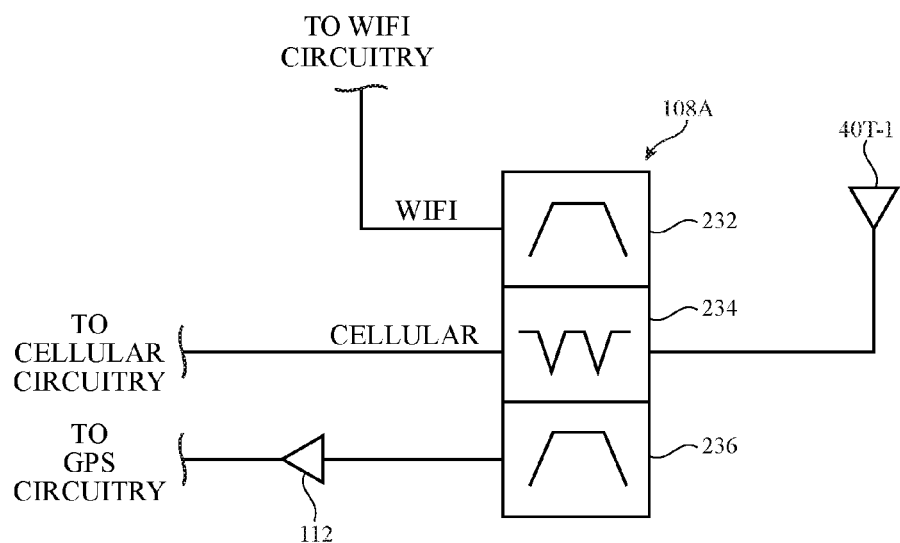
FIG. 9 is an illustrative diagram showing how frequency multiplexing circuitry may be implemented as a triplexer.

FIG. 9 is an illustrative diagram showing how frequency multiplexing circuitry (e.g., circuitry 108 of FIG. 3) may be implemented as a triplexer 108A. As shown in FIG. 9, triplexer 108A includes three filters 232, 234, and 236 that are connected to a single feed point of antenna 40T-1. Each filter of the triplexer may pass signals in only a predetermined range of frequencies. Filter 232 may handle WiFi signals (i.e., passes WiFi signals in a WiFi frequency band such as the 2.4 GHz band). Filter 234 may handle cellular frequencies in cellular telephone bands (e.g., LTE bands such as those in the frequency ranges between 699-960 MHz, 2300-2400 MHz, and 2496 to 2690 MHz). Filter 234 may, for example, be a notch filter with notches in its frequency response that block or otherwise prevents WiFi and GPS signals from passing between antenna 40T-1 and cellular circuitry. Filter 236 may handle GPS signals by passing radio-frequency signals in a GPS frequency band from antenna 40T-1 to LNA amplifier 112.

The example of FIG. 9 in which filters 232 and 236 are bandpass filters and filter 234 is a notch filter is merely illustrative. In general, triplexer 108A has first, second, and third filters that pass signals in only respective radio-frequency bands.

Figure 10:
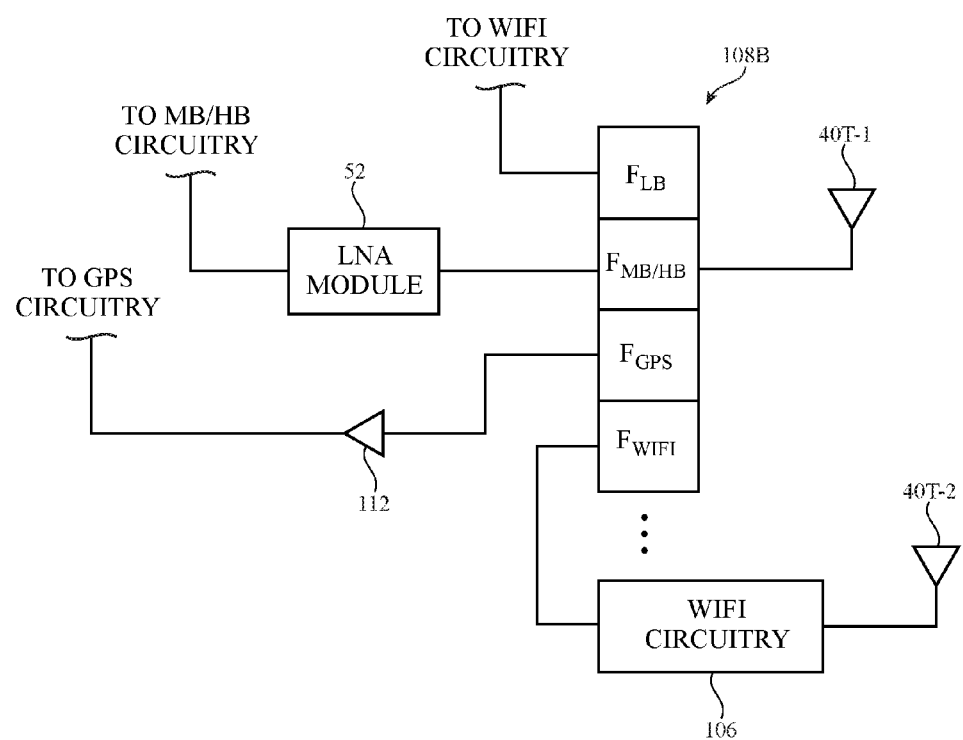
FIG. 10 is an illustrative diagram showing how frequency multiplexing circuitry may be implemented as a quadplexer.

If desired, multiplexing circuitry may be implemented as a quadplexer as shown in FIG. 10. In the example of FIG. 10, quadplexer 108B has four filters FLB, FMB/HB, FGPS, and FWIFI that couple a single feed point of antenna 40T-1 to transceiver circuitry. Consider the scenario in which quadplexer 108B serves as multiplexing circuitry 108 of FIG. 3. In this scenario, filter FLB may pass cellular low band signals from antenna 40T-1 to low band switching circuitry 124, filter FMB/HB may pass mid-band and high-band signals to low noise amplifier module 52, filter FPGS may pass GPS signals to low noise amplifier 112, and filter FWIFI may pass WiFi signals to WiFi circuitry 106.

The examples of FIGS. 9 and 10 in which a triplexer or a quadplexer is used to separate radio-frequency signals in different frequency bands is merely illustrative. If desired, any number of filters may be combined in a multiplexing component, which may be referred to generally as an N-plexer. Use of an N-plexer (e.g., a triplexer, quadplexer, etc.) allows communications in any desired number of frequency bands to be accommodated by a single antenna. The N-plexer may therefore help to reduce the number of antennas required to support communications in multiple frequency bands (e.g., cellular, WiFi, GPS, etc.).

The foregoing is merely illustrative and various modifications can be made by those skilled in the art without departing from the scope and spirit of the described embodiments. The foregoing embodiments may be implemented individually or in any combination.

What is claimed is:

1. An electronic device having first and second regions located at opposing ends of the electronic device, comprising:
   an antenna in the second region of the electronic device;
   transceiver circuitry in the first region of the electronic device;
   a low noise amplifier module in the second region of the electronic device and coupled between the transceiver circuitry and the antenna, wherein the low noise amplifier module amplifies receive signals from the antenna to the transceiver circuitry in a first configuration and passes transmit signals from the transceiver circuitry to the antenna in a second configuration, the antenna comprising a first antenna; and
   a second antenna in the first region of the electronic device, wherein the first antenna is located at a first distance from the transceiver circuitry, the second antenna is located at a second distance from the transceiver circuitry, the first distance is greater than the second distance, and the low noise amplifier module compensates for increased signal loss associated with the first distance.

2. The electronic device defined in claim 1, and wherein the electronic device further comprises:
   a transmission line that connects the first and second regions of the electronic device, wherein the transmission line conveys the transmit signals from the transceiver circuitry to the low noise amplifier module and conveys the amplified receive signals from the low noise amplifier module to the transceiver circuitry.

3. The electronic device defined in claim 1 further comprising:
switching circuitry located in the first region of the electronic device, wherein the switching circuitry selectively couples transmitter circuitry in the transceiver circuitry to the first and second antennas to provide antenna transmit diversity.

4. The electronic device defined in claim 1 wherein the low noise amplifier module comprises:
a first switching circuit coupled to the antenna;
a second switching circuit coupled to the transceiver circuitry;
at least one low noise amplifier coupled between the first and second switching circuits; and
a transmit bypass path coupled between the first and second switching circuits.

5. The electronic device defined in claim 4 wherein the at least one low noise amplifier comprises a plurality of low noise amplifiers for different frequency bands.

6. The electronic device defined in claim 5 wherein the plurality of low noise amplifiers comprises first and second low noise amplifiers and wherein the low noise amplifier module further comprises:
a filtering circuit coupled between the first low noise amplifier and the first switching circuit; and
a third switching circuit coupled between the first low noise amplifier and the filtering circuit.

7. The electronic device defined in claim 6 wherein the filtering circuit comprises a first filter for a first frequency band and a second filter for a second frequency band and wherein the third switching circuit electrically couples a selected one of the first and second filters to the first low noise amplifier.

8. The electronic device defined in claim 6 wherein the low noise amplifier module further comprises:
a duplexer having a first filter that is coupled between the second switching circuit and the first low noise amplifier and a second filter that is coupled between the second switching circuit and the second low noise amplifier.

9. An electronic device, comprising:
an antenna;
transceiver circuitry;
a low noise amplifier module coupled between the transceiver circuitry and the antenna, wherein the low noise amplifier module amplifies receive signals from the antenna to the transceiver circuitry in a first configuration and passes transmit signals from the transceiver circuitry to the antenna in a second configuration, the low noise amplifier module comprising:
a first switching circuit coupled to the antenna;
a second switching circuit coupled to the transceiver circuitry;
at least one low noise amplifier coupled between the first and second switching circuits;
a transmit bypass path coupled between the first and second switching circuits;
a first tunable filter coupled between the low noise amplifier and the first switching circuit; and
a second tunable filter coupled between the second switching circuit and the low noise amplifier.

10. A low noise amplifier module, comprising:
first and second ports;
a low noise amplifier coupled between the first and second ports, wherein the low noise amplifier is configured to amplify receive signals at the second port;
a transmit bypass path for passing transmit signals from the first port to the second port;
a first switching circuit that selectively couples the first port to the low noise amplifier and the transmit bypass path;
a second switching circuit that selectively couples the low noise amplifier and the transmit bypass path to the second port; and
a third switching circuit interposed between the low noise amplifier and the second switching circuit.

11. The low noise amplifier module defined in claim 10 wherein the low noise amplifier comprises one of a plurality of low noise amplifiers that are coupled between the first and second ports and wherein each of the plurality of low noise amplifiers handles a respective frequency band, the low noise amplifier further comprising:
filtering circuitry, wherein the third switching circuit is interposed between the plurality of low noise amplifiers and the filtering circuitry, and the third switching circuit and the filtering circuitry is configured to filter the receive signals into the frequency bands for amplification by the plurality of low noise amplifiers.

12. The electronic device defined in claim 9, further comprising:
control circuitry; and
control paths, wherein the control circuitry is configured to tune the first and second tunable filters by providing control signals to the first and second tunable filters over the control paths.

13. The electronic device defined in claim 9, wherein the low noise amplifier further comprises:
an additional filter coupled between the first tunable filter and the first switching circuit.

14. The electronic device defined in claim 9, wherein the low noise amplifier further comprises:
a first filter coupled between the second tunable filter and the second switching circuit.

15. The electronic device defined in claim 14, wherein the low noise amplifier further comprises:
a second filter coupled between the first tunable filter and the first switching circuit.

16. The electronic device defined in claim 15, wherein the low noise amplifier further comprises:
an additional low noise amplifier coupled between the first and second filters;
a third tunable filter coupled between the additional low noise amplifier and the first filter; and
a fourth tunable filter coupled between the additional low noise amplifier and the second filter.

* * * * *